(12) United States Patent
Hsu et al.

(10) Patent No.: US 12,172,117 B2
(45) Date of Patent: Dec. 24, 2024

(54) LAMINAR GAS FLOW FILTER

(71) Applicant: Taiwan Semiconductor Manufacturing Company, Hsinchu (TW)

(72) Inventors: Jyh-Shiou Hsu, Hsin-Chu (TW); Wen-Hsun Tsai, Taichung (TW); Chien-Chun Hu, Taichung (TW); Kuang-Wei Cheng, Hsinchu (TW); Sung-Ju Huang, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 409 days.

(21) Appl. No.: 17/572,375

(22) Filed: Jan. 10, 2022

(65) Prior Publication Data

US 2023/0012317 A1    Jan. 12, 2023

Related U.S. Application Data

(60) Provisional application No. 63/220,082, filed on Jul. 9, 2021.

(51) Int. Cl.
*B01D 46/10* (2006.01)
*B01D 29/01* (2006.01)
(Continued)

(52) U.S. Cl.
CPC ........... *B01D 46/10* (2013.01); *B01D 29/016* (2013.01); *B01D 35/30* (2013.01);
(Continued)

(58) Field of Classification Search
CPC .... B01D 46/00; B01D 46/10; H01L 21/67393
See application file for complete search history.

(56) References Cited

U.S. PATENT DOCUMENTS

| | | | | |
|---|---|---|---|---|
| 3,602,212 A | * | 8/1971 | Howorth | A61G 13/108 600/21 |
| 7,753,977 B2 | * | 7/2010 | Lyons | B01D 46/62 55/467 |

(Continued)

FOREIGN PATENT DOCUMENTS

| | | |
|---|---|---|
| JP | 2000188320 A | 7/2000 |
| JP | 2004200402 A | 7/2004 |

(Continued)

*Primary Examiner* — Robert A Hopkins
(74) *Attorney, Agent, or Firm* — Lippes Mathias LLP

(57) ABSTRACT

A method is provided for supporting environmental control in a semiconductor wafer processing space, the method includes: flowing a first gas under pressure in a first direction through a first diffuser tube, thereby generating a first lateral flow of gas through a sidewall of the first diffuser tube; flowing a second gas under pressure in a second direction through a second diffuser tube, thereby generating a second lateral flow of gas through a sidewall of the second diffuser tube, the second direction being opposite the first direction; combining the first and second lateral flows of gas within a housing; and outputting the combined lateral flows of gas from the housing to produce a laminar gas flow covering an opening to the semiconductor wafer processing space.

20 Claims, 9 Drawing Sheets

(51) Int. Cl.
  *B01D 35/30* (2006.01)
  *B01D 39/20* (2006.01)
  *B01D 61/18* (2006.01)
  *H01L 21/67* (2006.01)
  *H01L 21/673* (2006.01)

(52) U.S. Cl.
  CPC ......... *B01D 39/2089* (2013.01); *B01D 61/18* (2013.01); *H01L 21/67393* (2013.01)

(56) References Cited

U.S. PATENT DOCUMENTS

| | | |
|---|---|---|
| 2005/0173548 A1 | 8/2005 | Kramer |
| 2014/0053538 A1 | 2/2014 | Reeves et al. |
| 2022/0310429 A1* | 9/2022 | Shiu .................. H01L 21/67772 |

FOREIGN PATENT DOCUMENTS

| | | |
|---|---|---|
| JP | 2013058734 A | 3/2013 |
| KR | 20110109253 A | 10/2011 |
| KR | 20200145839 A | 12/2020 |
| WO | 2018073894 A1 | 4/2018 |

* cited by examiner

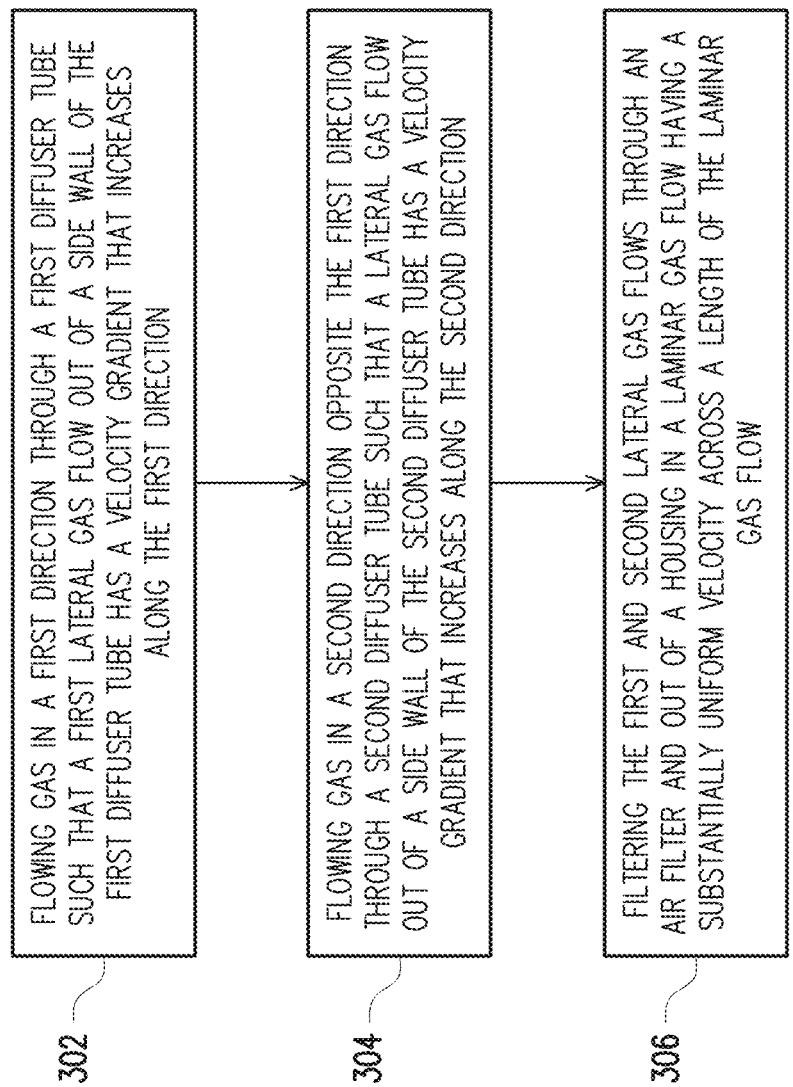

LAMINAR GAS FLOW FILTER

PRIORITY CLAIM AND CROSS-REFERENCE

This application claims the benefit of U.S. Provisional Application No. 63/220,082 filed Jul. 9, 2021, which is incorporated herein by reference in its entirety.

BACKGROUND

The following relates to the semiconductor manufacturing arts, and in particular, to a laminar gas flow filter for an environmentally controlled space used in connection with semiconductor fabrication.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

FIG. 7 is a flow chart showing a method of producing a clean laminar gas flow with a substantially uniform velocity across a length thereof in accordance with some embodiments disclosed herein.

DETAILED DESCRIPTION

Figure 1:
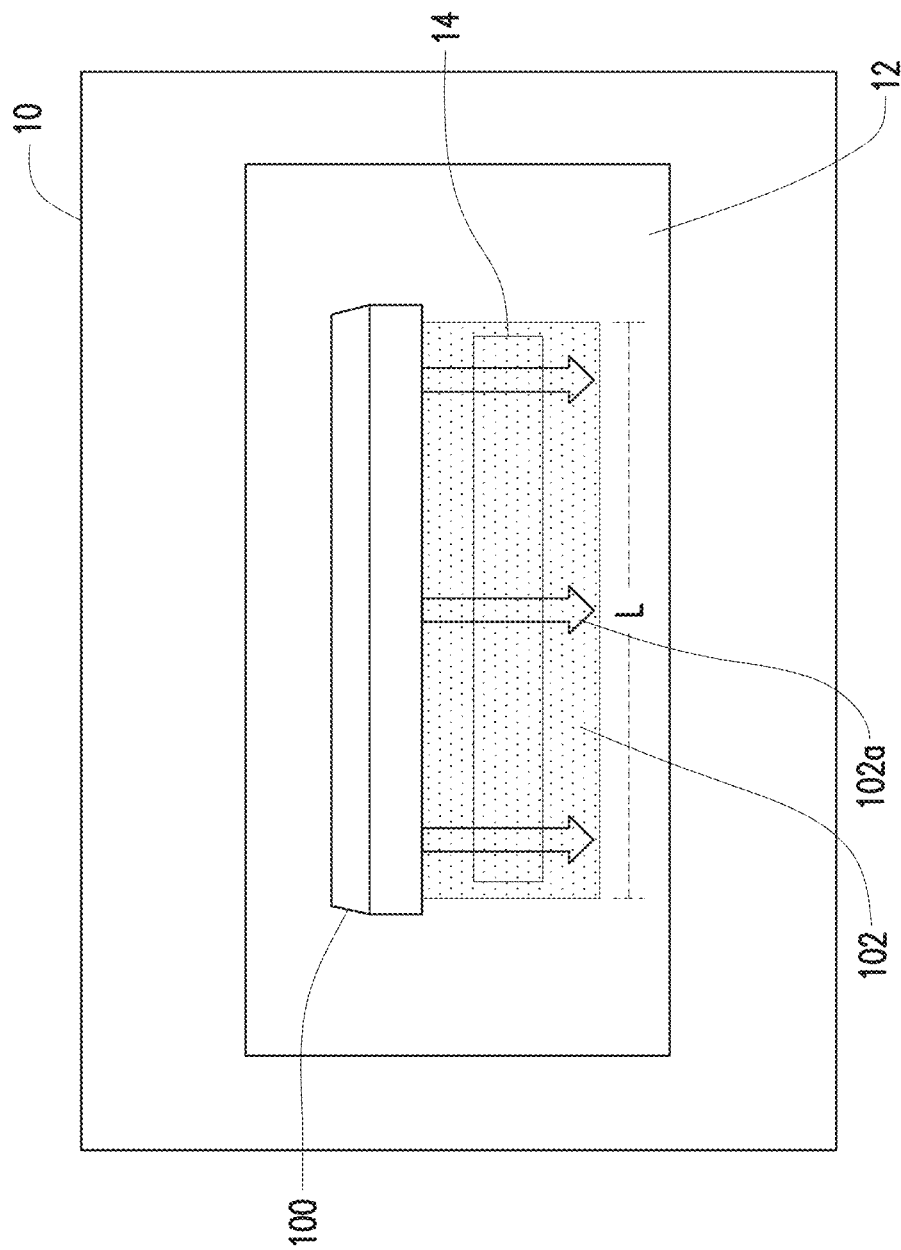
FIG. 1 diagrammatically illustrates an application of a laminar gas flow filter and/or apparatus in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, semiconductor devices, e.g., such as Metal-Oxide-Semiconductor Field-Effect Transistor (MOS-FET) devices, Integrated Circuits (ICs), etc. are manufactured and/or fabricated from semiconductor wafers in a semiconductor fabrication plant, commonly referred to as a FAB or foundry. There are commonly many processing steps applied to the semiconductor wafer to produce a desired semiconductor device and/or numerous semiconductor devices on a wafer. For example, semiconductor fabrication can be a multiple-step sequence of photolithographic, mechanical and/or chemical processing steps (for example, such as surface passivation, thermal oxidation, planar diffusion, junction isolation, etc.) during which electronic circuits and/or semiconductor devices are gradually created on the semiconductor wafer. Accordingly, a FAB clean room or other like space where fabrication takes place typically contains many individual pieces of machinery and/or tools for semiconductor device production, for example, without limitation, such as steppers and/or scanners for photolithography, in addition to tools for etching, cleaning, doping, testing, inspecting, etc. semiconductor wafers and load ports or the like for temporary staging and/or storage of semiconductor wafers. During the fabrication process, a semiconductor wafer is commonly transported from tool to tool and/or otherwise transferred to and/or from processing and/or holding chambers of various tools and/or equipment with a robotic arm or the like, for example, of an Equipment Front End Module (EFEM).

To maintain wafer quality and protect against defects during the semiconductor fabrication process, the FAB spaces and/or processing or holding chambers of various tools and/or equipment are environmentally controlled. That is to say, in the FAB spaces and/or various equipment chambers where semiconductor wafers are held and/or processed, efforts are undertaken to realize the environmental control of, for example, airborne molecular contaminants (AMCs), moisture, relative humidity (RH), oxygen ($O_2$), etc., in order to achieve an improved wafer quality and/or improved semiconductor fabrication processes, for example, with respect to limiting defects, improving wafer acceptance testing (WAT), circuit probe (CP), prolonged Q-time for the wafer, etc. Nevertheless, doors or openings to various FAB spaces and/or equipment chambers are provided, for example, to permit the ingress and/or egress of semiconductor wafers to and/or from the FAB spaces and/or equipment chambers. Therefore, in accordance with some exemplary embodiments disclosed herein, a laminar gas flow filter and/or apparatus is arranged to provide a laminar flow of gas, for example, a so-called air curtain, in front of and/or covering the opening to a semiconductor FAB space and/or equipment chamber, thereby aiding in maintaining the environmental control within the semiconductor FAB space and/or equipment chamber.

With reference now to FIG. 1, in accordance with some embodiments disclosed herein, there is shown a semiconductor wafer processing and/or staging tool 10 including a chamber 12 having an opening 14, for example, through which a semiconductor wafer is selectively loaded into and/or removed from the chamber 12. In some suitable embodiments, a laminar gas flow filter and/or apparatus 100 is arranged above the opening 14 to the chamber 12. In some embodiments, the laminar gas flow filter and/or apparatus 100 produces a laminar flow of gas or air curtain 102 (generally in a direction as indicated by the arrows 102a) in front of, adjacent and/or otherwise covering the opening 14 thereby aiding in maintaining the environmental control within the semiconductor FAB space and/or equipment chamber 12.

Figure 2A:
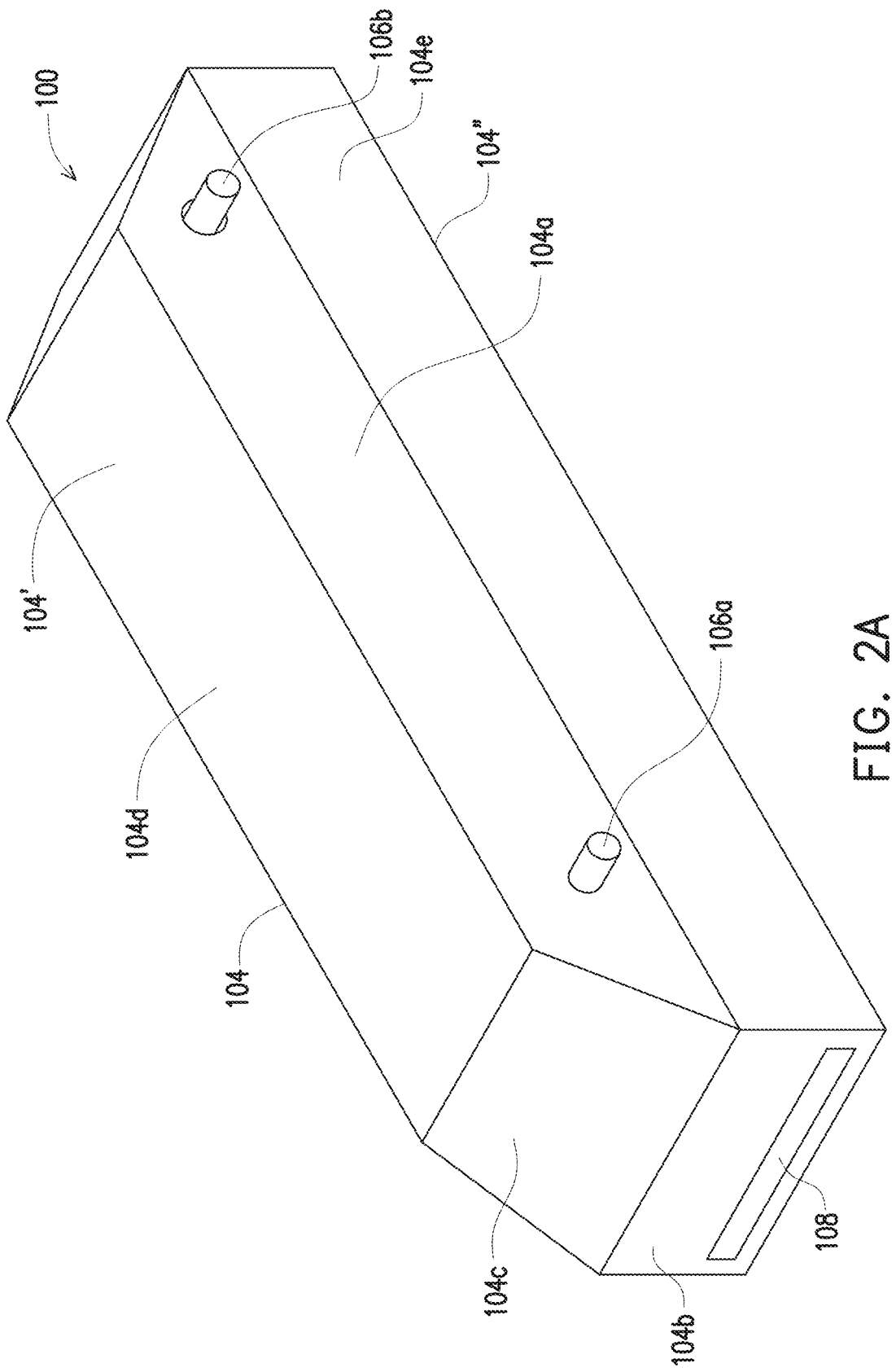
FIG. 2A diagrammatically illustrates a perspective view of a laminar gas flow filter and/or apparatus in accordance with some embodiments disclosed herein.

With reference now to FIG. 2A, there is shown a perspective view of the laminar gas flow filter and/or apparatus 100 in accordance with some embodiments disclosed herein. As shown, the laminar gas flow filter and/or apparatus 100 includes an outer housing 104 and a pair of gas inlets 106a and 106b that extend through a wall 104a of the housing 104 and supply a flow of gas under pressure to a respective pair of diffuser tubes contained within the housing 104. In accordance with some embodiments, the laminar gas flow filter and/or apparatus 100 also includes a removable and/or replaceable air filter that may be selectively installed within and/or removed from the housing 104, for example, via a suitable slot or port 108 provided in an end wall 104b of the housing 104.

Figure 3:
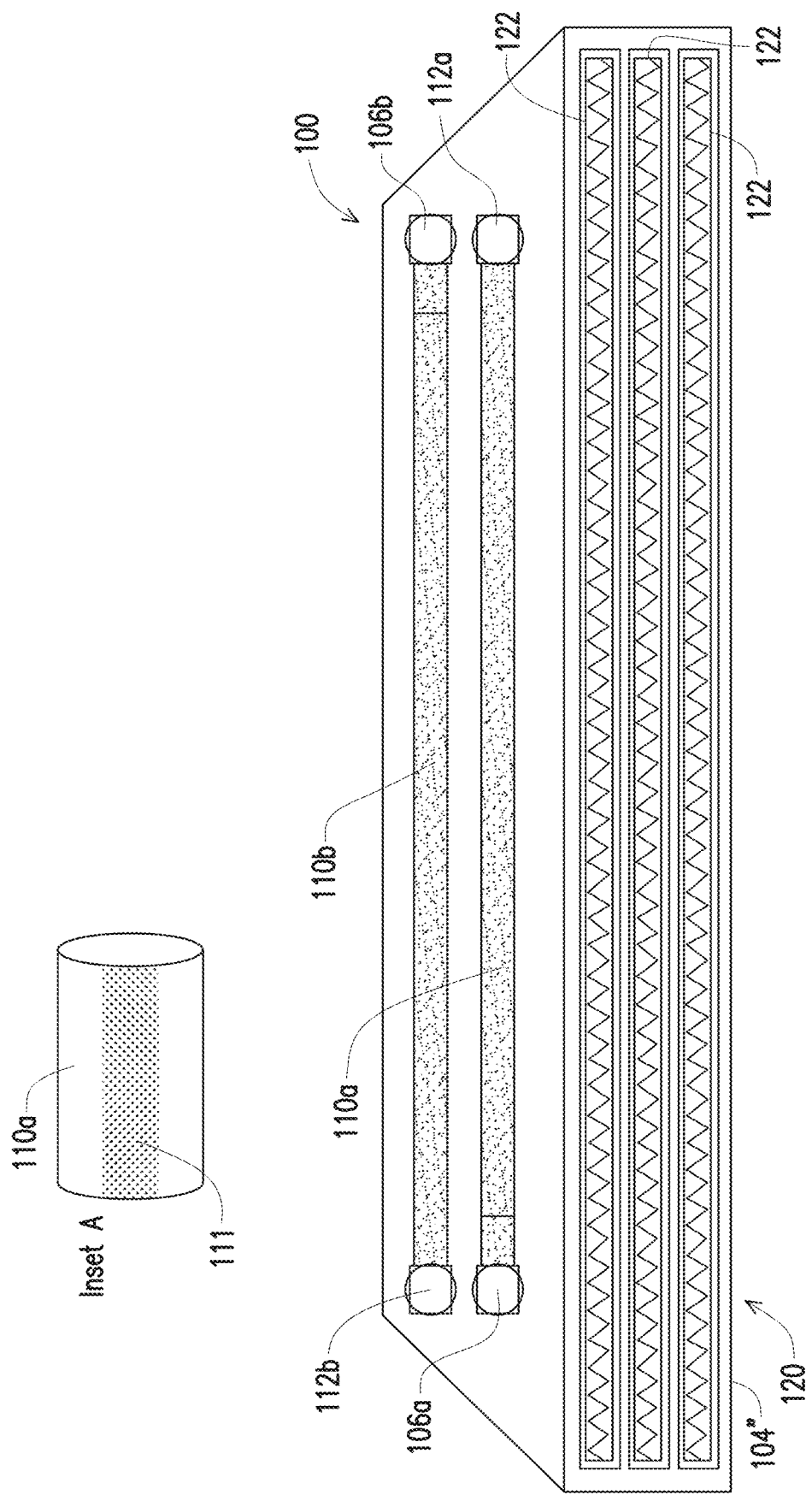
FIG. 3 diagrammatically illustrates a cross-section view of a laminar gas flow filter and/or apparatus in accordance with some embodiments disclosed herein.

With reference now to FIG. 3, there is shown a cross-section view of the laminar gas flow filter and/or apparatus 100 in accordance with some embodiments disclosed herein. As shown, the laminar gas flow filter and/or apparatus 100 includes a pair of diffuser tubes 110a and 110b contained within the housing 104. In some embodiments, the diffuser tubes 110a and 110b are symmetrically arranged within the housing 104, and are parallel to one another. Suitably, each diffuser tube 110a and 110b is supplied a flow of gas under pressure via the respective gas inlets 106a and 106b connected to the diffuser tubes 110a and 110b at opposite ends of the diffuser tubes 110a and 110b. That is to say, as shown in FIG. 3, the gas inlet 106a is connected to the left end of the diffuser tube 110a, while the gas inlet 106b is connected to the right end of the diffuser tube 110b.

In some embodiments, a pair of diffuser heads 112a and 112b are connected to the respective pair of diffuser tubes 110a and 110b at the ends of the diffuser tubes 110a and 110b opposite the ends of the respective diffuser tubes 110a and 110b which are connected to the respective gas inlets 106a and 106b. That is to say, as shown in FIG. 3, the diffuser head 112a is connected to the right end of the diffuser tube 110a opposite the left end of the diffuser tube 110a to which the gas inlet 106a is connected, while the diffuser head 112b is connected to the left end of the diffuser tube 110b opposite the right end of the diffuser tube 110b to which the gas inlet 106b is connected.

In some embodiments, as shown in FIG. 3, the laminar gas flow filter and/or apparatus 100 also includes an air filter module 120. In some embodiments, the air filter module 120 is sized and/or otherwise configured to house, contain and/or hold one or more air filters 122 therein. Suitably, the air filter module 120 is sized and/or otherwise configured to house, contain and/or hold a plurality of air filters 122 therein. As shown in FIG. 3, the air filter module 120 is sized and/or otherwise configured to house, contain and/or hold three air filters 122 therein. However, in practice, it is to be appreciated that the air filter module 120 may be sized and/or otherwise configured to accommodate more or less than three air filters 122. In some embodiments, a multi-layer air filter 122 may be employed.

Figure 4:
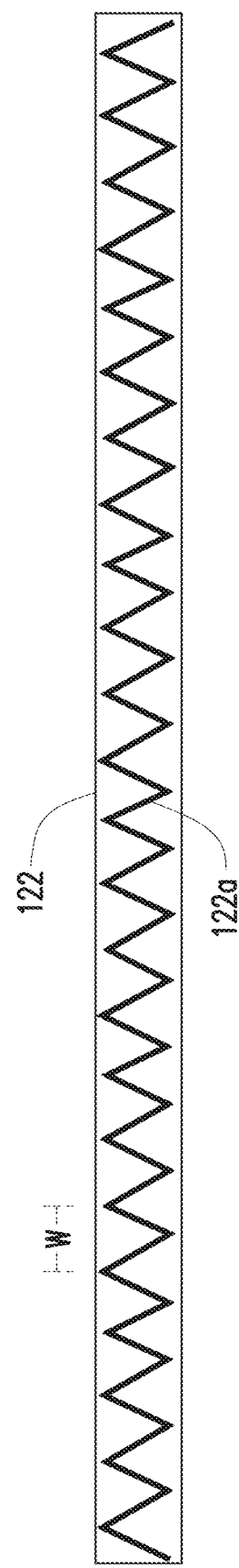
FIG. 4 diagrammatically illustrates an air filter used in a laminar gas flow filter and/or apparatus in accordance with some embodiments disclosed herein.

In some embodiments, the air filter 122 is an ultra-low particulate air (ULPA) filter, for example, suitable for capturing and/or filtering out air particulates down to a size of about 2.6 mm. Suitably, the air filter 122 may comprise a fiber filter and may include one or more corrugated layers 122a, for example, as diagrammatically illustrated in FIG. 4. In some embodiments, a pitch w of the corrugation is suitably small, for example, in a range of about 0.1 mm to about 100 mm. In some embodiments, the pitch w of the corrugation is about 0.5 mm. In some embodiments, the fiber filter may be made from polytetrafluoroethylene (PTFE), polyethylene (PE), polyethylene terephthalate (PET), combinations thereof, and/or other like materials.

Returning attention now to FIG. 3, suitably, the air filter module 120 is selectively removable from the laminar gas flow filter and/or apparatus 100. For example, the housing 104 of the laminar gas flow filter and/or apparatus 100 may include a first upper portion 104' and a second lower portion 104". In some embodiments, the diffusion tubes 110a and 110b may reside in the first upper portion 104' of the housing 104, while the air filters 122 may reside in the second lower portion 104" of the housing 104. Accordingly, the second lower portion 104" of the housing 104, along with the air filters 122, may comprise the air filter module 120.

In some embodiments, the second lower portion 104" of the housing 104 may be selectively connected to and/or disconnected from the first upper portion 104' of the housing 104, for example, via suitable fasteners and/or fastening mechanisms, thereby allowing the air filter module 120 to be selectively installed on and/or removed from the laminar gas flow filter and/or apparatus 100. In some embodiments, a removed air filter module 120 may be selectively replaced with another air filter module 120 so that used or dirty air filters 122 in the removed air filter module 120 are replaced with new or clean air filters 122 in the replacement air filter module 120.

In some embodiments, the entire air filter module 120 is selectively replaced. That is to say, an air filter module 120 containing used or dirty air filters 122 is disconnected and/or otherwise removed from the laminar gas flow filter and/or apparatus 100, and another air filter module 120 containing new or clean air filters 122 is connected to and/or otherwise installed on the laminar gas flow filter and/or apparatus 100. In other embodiments, the air filter module 120 may be removed, the used or dirty air filters 122 in the removed air filter module 120 may be replaced and/or otherwise swapped out with new or clean air filters 122, and the air filter module 120 with the replacement filters 122 reinstalled.

Figure 5:
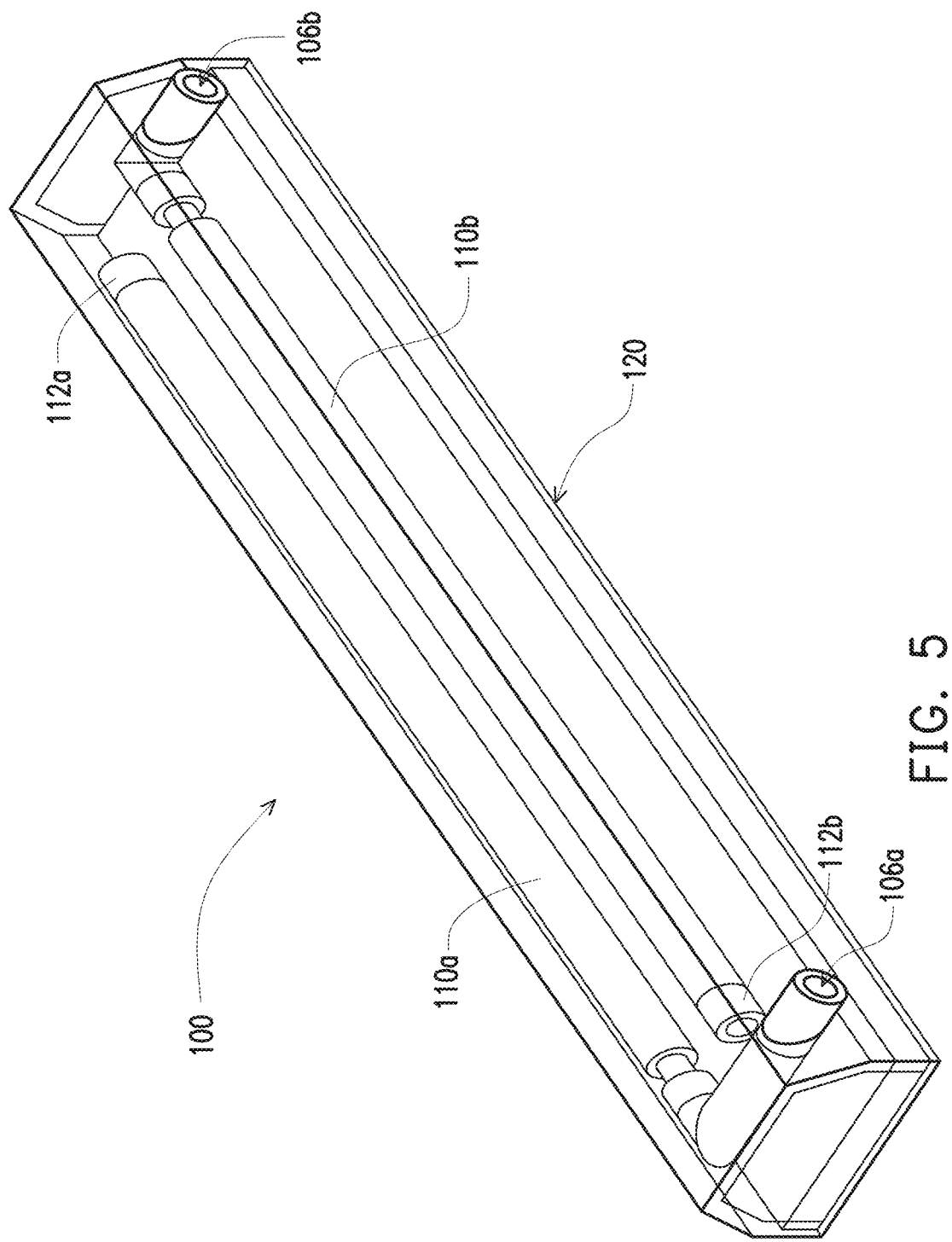
FIG. 5 diagrammatically illustrates another perspective view showing interior elements of a laminar gas flow filter and/or apparatus in accordance with some embodiments disclosed herein.

In some suitable embodiments, as shown in FIG. 3, the mutually parallel diffuser tubes 110a and 110b are contained and/or otherwise positioned within the housing 104, for example, in the first upper portion 104', over and/or above the air filter module 120 and/or air filters 122. In FIG. 3 the diffuser tubes 110a and 110b are at different elevations, e.g. diffuser tube 110b is above diffuser tube 110a. However, they can have other spatial arrangements in which the diffuser tubes are mutually parallel. For example, in another embodiment the diffuser tubes 110a and 110b are positioned at the same or substantially the same elevation, i.e. in a side-by-side arrangement, as shown in FIG. 5.

In some suitable embodiments, the diffuser tube 110a is a cylindrical tube including or defining a sidewall of the diffuser tube extending from a first end connected to the gas inlet 106a to a second opposite end connected to the diffuser head 112a, and the diffuser tube 110b is likewise a cylindrical tube including a sidewall extending from a first end connected to the gas inlet 106b to a second opposite end connected to the diffuser head 112b. In some embodiments, the sidewall of each of the pair of diffuser tubes 110a and 110b is perforated and/or otherwise sufficiently porous to permit a gas flow through the sidewall. In the main drawing of FIG. 3, the perforations extend all the way around the circumference of the circumferential sidewall of each diffuser tube. Alternatively, as shown in Inset A, the perforations may extend over only a portion 111 of the circumference of the sidewall of diffusion tube 110a (and similarly for diffusion tube 110b). In some alternate embodiments, the diffuser tubes 110a and 110b may be other than cylindrical in shape.

In some suitable embodiments, each of the pair of diffuser tubes 110a and 110b may be made from a perforated or sufficiently porous plastic material to permit a gas flow through the sidewall thereof. In some suitable embodiments, each of the diffuser tubes 110a and 110b may have a diameter in a range of about 1 mm to about 100 mm. In some suitable embodiments, each of the diffuser tubes 110a and 110b may have a length L (indicated in FIG. 1) in a range of about 10 mm to about 1000 mm, for example, depending on a size of the opening 14 for the chamber 12 of the semiconductor wafer processing tool 10 which the laminar gas flow produced by the laminar gas flow filter and/or apparatus 100 is intended to cover. The choice of length L is suitably made based on the size of the opening 14 of the chamber 12 or other space being protected by the air curtain. For example, a longer length such as 1000 mm or even longer may be appropriate for providing an air curtain across a doorway through which FAB personnel ingress into and/or egress from a room; while a short length such as 10 mm or even shorter may be appropriate for providing an air curtain through which a tube or the like passes.

In some suitable embodiments, each of the diffuser heads 112a and 112b is a cap or plug or the like which acts to close off the end of the respective diffuser tuber 110a and 110b to which the respective diffuser heads 112a and 112b are connected. In some embodiments, each of the diffuser heads 112a and 112b is perforated and/or otherwise sufficiently porous to permit a gas flow therethrough. In some suitable embodiments, each of the diffuser heads 112a and 112b may be made from a perforated or sufficiently porous plastic material.

In some suitable embodiments, each gas inlet 106a and 106b supplies the respective diffuser tube 110a and 110b to which it is connected with a flow of gas under pressure. For example, a suitable gas may be blown or pumped into the respective diffuser tubes 110a and 110b via their respective gas inlets 106a and 106b. In some embodiments, the gas may be nitrogen ($N_2$), dry air, or some combination thereof or another like suitable gas. In some suitable embodiments, the gas is supplied to each of the pair of diffuser tubes 110a and 110b via their respective gas inlets 106a and 106b at a flow rate in a range of about 10 liters per minute (l/m) to about 1000 l/m. In some suitable embodiments, the gas is supplied to each of the pair of diffuser tubes 110a and 110b via their respective gas inlets 106a and 106b at a pressure in a range of about 0.1 standard atmosphere (atm) to about 10 atm.

In some suitable embodiments, as a result of the supplied flow of gas under pressure to each diffuser tube 110a and 110b via their respective gas inlets 106a and 106b, a flow of gas is correspondingly produced out through the perforated and/or sufficiently porous sidewall of each diffuser tube 110a and 110b respectively. Consequently, the combined flows of gas coming out through the perforated and/or sufficiently porous sidewalls of both of the diffuser tubes 110a and 110b create a flow of gas through the air filter module 120 and/or air filter 122, thereby producing the laminar flow of gas 102 out of the laminar gas flow filter and/or apparatus 100.

In some embodiments, the symmetrical arrangement of the diffuser tubes 110a and 110b helps create uniformity in the output gas flow velocity across a length l of the produced laminar gas flow 102. More specifically, the gas flow out through the sidewall of either one of the diffuser tubes 110a or 110b having its respective gas inlet 106a or 106b arranged at a given end thereof is generally not uniform along the length of the tube. Rather, the velocity of the gas flow out from a sidewall of a given one of the diffuser tubes tends to gradually increase along the length of the tube going from the gas inlet end of the tube toward the diffuser head end of the tube. Accordingly, by flipping left to right the respective gas inlets 106a and 106b and respective diffuser heads 112a and 112b of the respective diffuser tubes 110a and 110b so that adjacent or otherwise proximate ends of the diffuser tubes 110a and 110b are connected to differing ones of the gas inlets 106a and 106b and diffuser heads 112a and 112b, the otherwise gradually increasing gas flow velocities out of the sidewalls of the diffuser tubes 110a and 110b combine and/or complement one another to effectively off-set the respective gas flow velocity gradients out of the individual tubes' sidewalls and produce a generally more uniform velocity of the gas flow 102 along the length of the laminar gas flow filter and/or apparatus 100.

Figure 6:
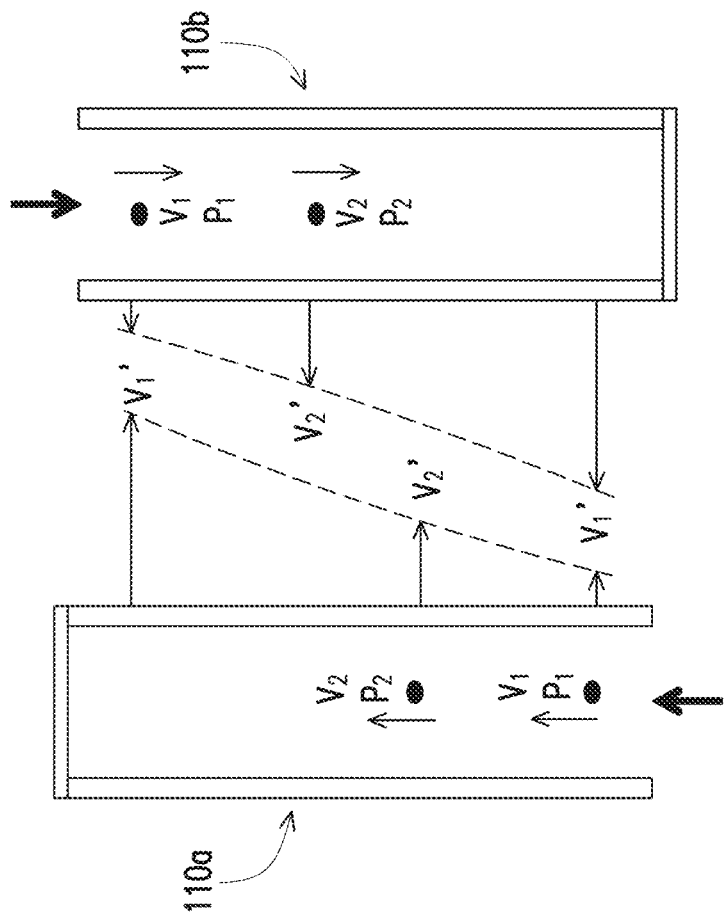
FIG. 6 diagrammatically illustrates a diffuser tube used in a laminar gas flow filter and/or apparatus in accordance with some embodiments disclosed herein.
Figure 6:
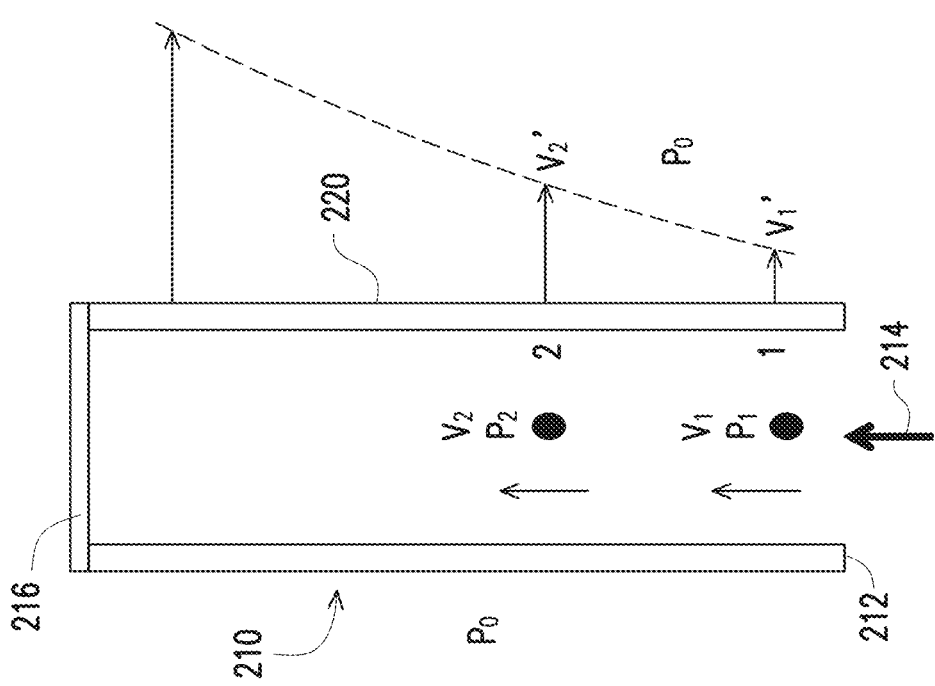

For example, as seen in FIG. 6 (where diffuser tube 210 could be either diffuser tube 110a or 110b), at a given location relatively nearer the gas inlet 106a of the diffuser tube 110a, a velocity of the gas flow out from the sidewall of the diffuser tube 110a is generally less than a velocity of the gas flow out from the sidewall of the diffuser tube 110a at a given location relatively nearer the diffuser head 112a of the diffuser tube 110a. That is to say, along the length of the diffuser tube 110a progressing from the gas inlet 106a to the diffuser head 112a (i.e., from left to right as shown in FIG. 3 for example), the velocity of the gas flow out from the sidewall of the diffuser tube 110a generally increases gradually.

Likewise, for example, at a given location relatively nearer the gas inlet 106b of the diffuser tube 110b, a velocity of the gas flow out from the sidewall of the diffuser tube 110b is generally less than a velocity of the gas flow out from the sidewall of the diffuser tube 110b at a given location relatively nearer the diffuser head 112b of the diffuser tube 110b. That is to say, along the length of the diffuser tube 110b progressing from the gas inlet 106b to the diffuser head 112b (i.e., from right to left as shown in FIG. 3 for example), the velocity of the gas flow out from the sidewall of the diffuser tube 110b generally increases gradually.

Accordingly, in some embodiments, the end of the diffuser tube 110a connected to the gas inlet 106a is arranged adjacent to or proximate the end of the diffuser tube 110b connected to the diffuser head 112b, and the end of the diffuser tube 110a connected to the diffuser head 112a is arranged adjacent to or proximate the end of the diffuser tube 110b connected to the gas inlet 106b. In this way, the gas flow velocity gradients experienced by the gas flows exiting out of the sidewalls of the diffuser tubes 110a and 110b are flipped (i.e., left to right) with respect to one another and therefore combine and/or complement one another to effectively off-set the respective gas flow velocity gradients out of the individual tubes' sidewalls and produce a generally more uniform velocity of the gas flow 102 along the length of the laminar gas flow filter and/or apparatus 100.

With reference now to FIG. 6, there is shown a diagrammatic illustration of a diffuser tube 210 in accordance with some embodiments disclosed herein. For example, the diffuser tube 210 may be representative of either one of the pair of diffuser tubes 110a or 110b. As shown, the diffuser tube 210 includes a gas inlet end 212, for example, which may be connected to a gas inlet, for example, such as the gas inlets 106a and 106b. As represented by the arrow 214, the diffuser tube 210 is supplied a flow of gas under pressure at the gas inlet end 212. The end of the diffuser tube 210 opposite the gas inlet end 212 may be consider the diffuser head end 216 of the diffuser tube 210, for example, which may be connected to and/or capped by a diffuser head, for example, such as the diffuser heads 112a and 112b. As shown, a sidewall 220 of the diffuser tube 210 extends from the gas inlet end 212 of the diffuser tube 210 to the diffuser head end 216 of the diffuser tube 210. In some embodiments, the sidewall 220 of the diffuser tube 210 is perforated and/or otherwise sufficiently porous to permit a gas flow out therethrough along the length of the sidewall 220. As shown in FIG. 6, a velocity V' of the gas flow out through the sidewall 220 of the diffuser tube 210 experiences a gradient (i.e., a gradual increase in velocity) progressing along the length of the sidewall 220 from the gas inlet end 212 of the diffuser tube 210 toward the diffuser head end 216 of the diffuser tube 210. For example, as shown in FIG. 6, at a first location or position 1 along the sidewall 220 of the diffuser tube 210 (relatively nearer to the gas inlet end 212 of the diffuser tube 210), the velocity $V_1'$ of the gas flow out through the sidewall 220 of the diffuser tube 210 is less than the velocity $V_2'$ of the gas flow out through the sidewall 220 of the diffuser tube 210 at a second location or position 2 along the sidewall 220 of the diffuser tube 210 (relatively nearer to the diffuser head end 216 of the diffuser tube 210).

More specifically, according to Bernoulli's principal and/or equation (without heat transfer):

$$P_{total} = P_{static} + P_{dynamic} = \text{Constant}$$

where, $P_{total}$ is the total pressure (also at times designated by $p_0$ or $P_0$), $P_{static}$ is the static pressure (also at times designated simply by p or P), and $P_{dynamic}$ is the dynamic pressure (also at times designated by q or Q).

In general, $P_{dynamic}$ or Q (which represents or can be thought of as the kinetic energy of the gas per unit volume) may be given as:

$$\tfrac{1}{2}\rho V^2$$

where $\rho$ is the density of the gas, and V is the gas flow speed or velocity.

Accordingly, from the foregoing, it follows that:

$$P_{total} = P_{static} + P_{dynamic} = \text{Constant}$$
$$= P_1 + 1/2\, \rho\, V_1^2$$
$$= P_2 + 1/2\, \rho\, V_2^2$$

where $P_1$ is the static pressure at point 1 within the diffuser tube 210, $P_2$ is the static pressure at point 2 within the diffuser tube 210, $V_1$ is the gas flow speed at point 1 within the diffuser tube 210, and $V_2$ is the gas flow speed at point 2 within the diffuser tube 210.

In some embodiments disclosed herein, $Q_1$ (i.e., the value of Q at point 1 within the diffuser tube 210) is greater than $Q_2$ (i.e., the value of Q at point 2 within the diffuser tube 210). Accordingly, it follows that $V_1$ is greater than $V_2$ and in turn that $P_2$ is greater than $P_1$. Consequently, as $P_2$ is greater than $P_1$, it follows that $V_2'$ is greater than $V_1'$.

That is to say, in some embodiments disclosed herein, as a flow of gas under pressure is supplied to (i.e., blown and/or pumped into) the diffuser tube 210 from the gas inlet end 212 of the diffuser tube 210, the static pressure P within the diffuser tube 210 generally increase gradually along a length of the diffuser tube 210 progressing from the gas inlet end 216 of the diffuser tube 210 toward the diffuser head end 216 of the diffuser tube 210. Consequently, a velocity V' of the gas flow exiting through the sidewall 220 of the diffuser tube 210 generally increase gradually along a length of the diffuser tube 210 progressing from the gas inlet end 216 of the diffuser tube 210 toward the diffuser head end 216 of the diffuser tube 210. Accordingly, in some embodiments (for example, as shown in FIG. 5), by arranging a pair of diffuser tubes 110a and 110b such that the respective gas inlets 106a and 106b therefor are positioned on opposite ends of the respective diffuser tubes 110a and 110b, the velocity V' of the gas flow exiting through the sidewalls of the respective diffuser tubes 110a and 110b generally increases gradually along a length of each of the diffuser tubes 110a and 110b in opposite directions, thereby tending to off-set and/or otherwise complement one another to produce an output laminar gas flow 102 from the laminar gas flow filter and/or apparatus 100 which is generally uniform in velocity across its length l. (As used herein, "opposite" indicates opposing flows effective to produce this complementary effect. Hence, the mutually parallel diffusion tubes 110a, 110b can have slight angular deviations of up to a few degrees from being perfectly mutually parallel). FIG. 6, Inset B illustrates this complementary effect produced by mutually parallel first and second diffuser tubes 110a, 110b.

In a variant embodiment (not shown), the two inlets 106a and 106b (see FIGS. 2 and 3) may be fed from a single gas supply tube or pipe, with a "T"-connector or other gas flow splitter fitting dividing the gas flow from the single gas supply tube or pipe so that one-half of the flow is fed to inlet 106a and the other half of the flow is fed to inlet 106b. Optionally, the gas flow splitter may include a flow adjuster that can adjust the fraction of the flow fed to inlet 106a versus inlet 106b. The flow adjuster can then be adjusted to tune the flow balance to compensate for any difference in the lateral flow resistance through the sidewall of diffuser tube 110a compared with diffuser tube 110b, in order to obtain suitably complementary lateral flows over the lengths of the mutually parallel diffuser tubes 110a, 110b.

With reference now to FIG. 7, there is shown, in accordance with some suitable embodiments disclosed herein, a process and/or method 300 for producing a filtered laminar gas flow having a substantially uniform velocity across a length of the laminar gas flow, for example, employing the laminar gas flow filter and/or apparatus 100.

In some suitable embodiments, as shown in FIG. 7, step 302 includes flowing gas in a first direction through a first diffuser tube (for example, diffuser tube 110a) such that a first lateral gas flow out of a sidewall of the first diffuser tube has a velocity gradient that increases along the first direction.

In some suitable embodiments, as shown in FIG. 7, step 304 includes flowing gas in a second direction opposite the first direction through a second diffuser tube (for example, diffuser tube 110b) such that a lateral gas flow out of a sidewall of the second diffuser tube has a velocity gradient that increases along the second direction.

While shown in FIG. 7 as successive steps, it is to be appreciated that in practice steps 302 and 304 are suitably executed concurrently or otherwise in parallel in accordance with some suitable embodiments disclosed herein.

In some suitable embodiments, as shown in FIG. 7, step 306 includes filtering the first and second lateral gas flows through an air filter (for example, air filter 122 and/or air filter module 120) and out of a housing (for example, housing 104) in a laminar gas flow (for example, such as laminar gas flow 102) having a substantially uniform velocity across a length (for example, length l) of the laminar gas flow.

While some embodiments herein, for example, as shown in FIG. 5, are disclosed with a pair of symmetrically arranged diffuser tubes 110a and 110b having gas inlets 106a and 106b at opposite ends thereof, it is to be appreciated that in some alternative embodiments, a plurality of pairs of such mated diffuser tubes may likewise be employed in the laminar gas flow filter and/or apparatus 100.

In accordance with some alternative embodiments, a single diffuser tube may be employed in the laminar gas flow filter and/or apparatus 100 as opposed to the mated pair of diffuser tubes 110a and 110b. In this case, the single diffuser tube may have a sidewall with perforations and/or a gas permeability or porosity that progressively varies along a length of the diffuser tube. In practice, the perforations and/or gas permeability or porosity of the sidewalls of the diffuser tube varies along its length to compensate for an increasing static pressure experienced within the diffuser tube as a flow of gas is supplied thereto via a gas inlet feeding the diffuser tube, for example, in a manner such that a velocity of a lateral gas flow out though the sidewall of the diffuser tube is maintained substantially uniform along the length of the diffuser tube. In some suitable embodiments, a plurality of such diffuser tubes with progressively variable perforations, gas permeability and/or porosity along their lengths may be employed in the laminar gas flow filter and/or apparatus 100, in which case the gas inlets therefor may optionally be connected to the ends thereof on the same side.

Figure 2B:
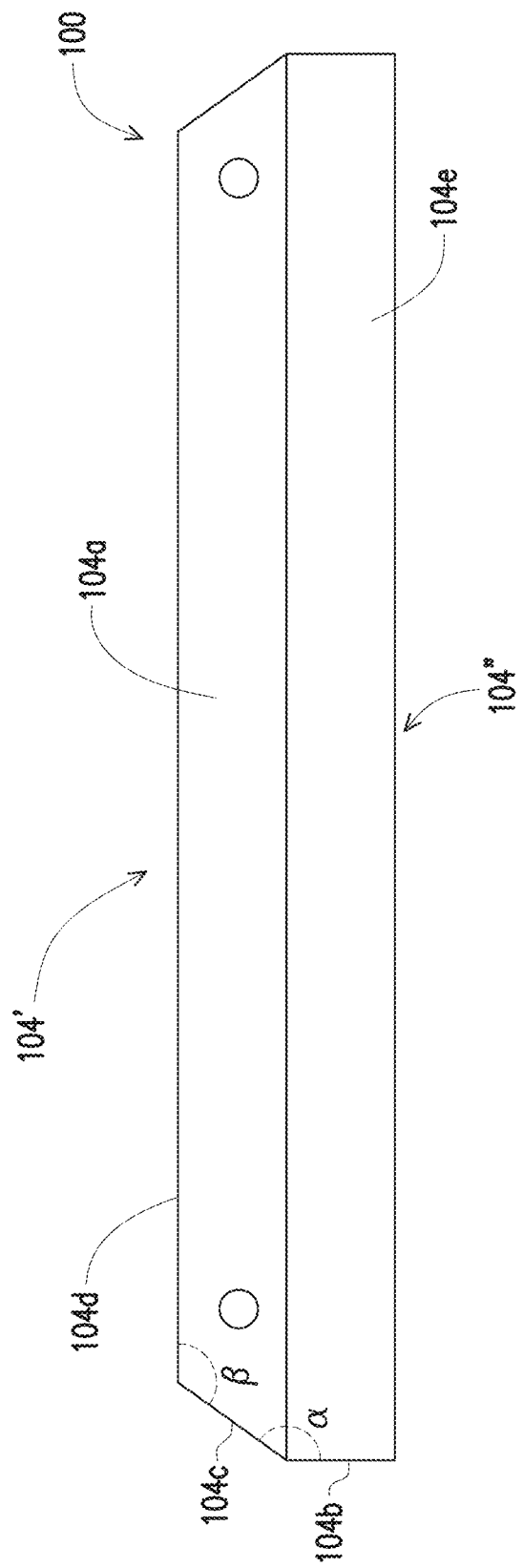
FIG. 2B diagrammatically illustrates a front plan view of a laminar gas flow filter and/or apparatus in accordance with some embodiments disclosed herein.
Figure 2C:
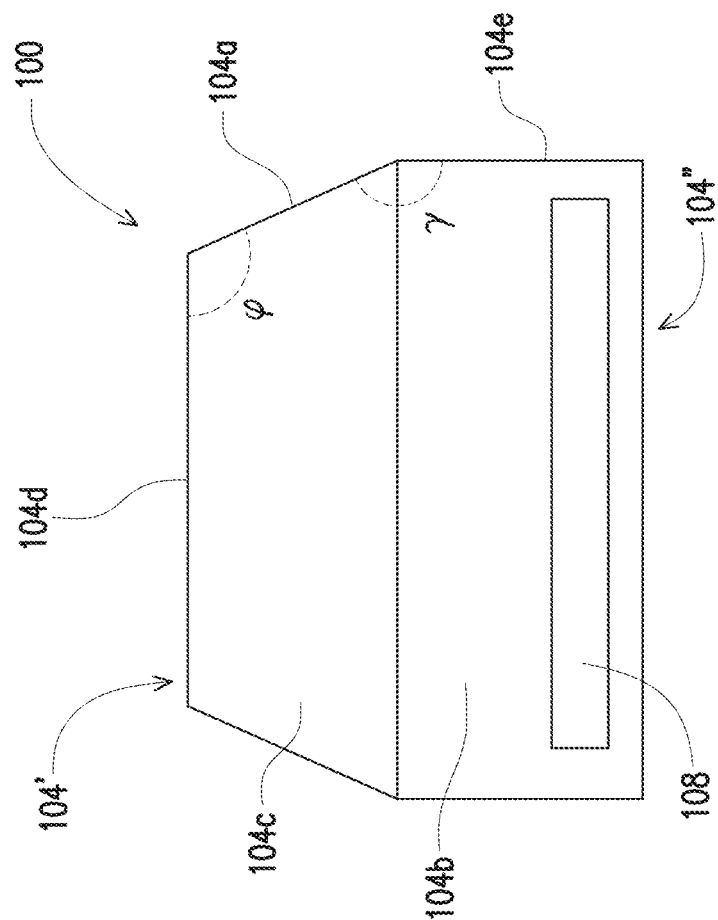
FIG. 2C diagrammatically illustrates an end plan view of a laminar gas flow filter and/or apparatus in accordance with some embodiments disclosed herein.

In some suitable embodiments, for example, as shown in FIGS. 2A, 2B and 2C, the housing 104 is formed to be somewhat smooth and/or with sloping walls (for example, walls 104a and 104c) extending between the sidewalls (for example, walls 104b and 104e) and the top wall (for example, wall 104d) and/or otherwise lacking in sharp interior angles between adjacent walls of the housing 104. In some suitable embodiment, the interior angles between selected adjacent walls of the housing 104 may be maintained at greater than about 90 degrees. For example, the interior angle α formed between the sidewall 104b of the housing 104 and the sloping wall 104c of the housing 104 may be greater than 90 degrees; the interior angle β formed between the sloping wall 104c of the housing 104 and the top wall 104d of the housing 104 may be greater than 90 degrees; the interior angle φ formed between the top wall 104d of the housing 104 and the sloping wall 104a of the housing 104 may be greater than 90 degrees; the interior angle γ formed between the sloping wall 104a of the housing 104 and the sidewall 104e of the housing 104 may be greater than 90 degrees; and so on. Advantageously, the reduction of sharp interior angles within the housing 104 in this manner helps to reduce and/or guard against the formation of unwanted vortexes within the gas flow in the housing 104 and further promote uniformity in the output laminar gas flow 102 from the laminar gas flow filter and/or apparatus 100.

Advantageously, the laminar gas flow filter and/or apparatus 100 as disclosed herein produces an output clean laminar gas flow 102 having a substantially uniform gas flow velocity across its length l, for example, in a range of about 0.01 meters per second (m/s) to about 10 m/s. In some suitable embodiments, with the use of the laminar gas flow filter and/or apparatus 100 as disclosed herein a volatile organic compound (VOC) level of less than about 1000 ppbV (parts per billion by volume) may be achieved, maintained and/or otherwise established; and/or one or more of the following environmental control conditions $O_2<1\%$, RH %<10%, and/or particle<3 ea at 45 nm may be achieved, maintained and/or otherwise established.

Some suitable embodiments of the laminar air flow filter and/or apparatus 100 disclosed herein are applicable to various semiconductor fabrication processing spaces, for example, a wet bench and/or processing space, an etching station and/or processing space, a physical vapor deposition (PVD) processing space, etc. In some suitable embodiment, for example, employing relatively larger diffuser tubes 110a and 110b, the laminar air flow filter and/or apparatus 100 may be employed to produce a clean laminar gas flow 102 to cover a man-door or other entrance to a FAB clean room or other like semiconductor fabrication space.

In the illustrative embodiments, there are two mutually parallel diffuser tubes 110a, 110b with gas flow in opposite directions. In a further variant embodiment, the first diffuser tube 110a could comprise two (or more) diffuser tubes providing the cumulative air flow of the illustrative single first diffuser tube 110a. Likewise, the second diffuser tube 110b could similarly be optionally configured as two (or more) diffuser tubes providing the cumulative air flow of the illustrative single second diffuser tube 110b.

In the following, some further illustrative embodiments are described.

In some embodiments, a method is provided for supporting environmental control in a semiconductor wafer processing space, the method includes: flowing a first gas under pressure in a first direction through a first diffuser tube, thereby generating a first lateral flow of gas through a sidewall of the first diffuser tube; flowing a second gas under pressure in a second direction through a second diffuser tube, thereby generating a second lateral flow of gas through a sidewall of the second diffuser tube, the second direction being opposite the first direction; combining the first and second lateral flows of gas within a housing; and outputting the combined lateral flows of gas from the housing to produce a laminar gas flow covering an opening to the semiconductor wafer processing space.

In some further embodiments, the method further includes filtering the combined lateral flows of gas prior to the outputting from the housing.

In still additional embodiments, the first lateral flow of gas has a first gas flow velocity that increases along the first direction and the second lateral flow of gas has a second gas flow velocity that increases along the second direction.

In some embodiments, the first lateral flow of gas is substantially normal to the first direction, and the second lateral flow of gas is substantially normal to the second direction.

In yet further embodiments, the filter includes passing the combined lateral flows of gas through an air filter, the air filter being selectively removable from the housing.

In some further embodiments, the air filter is an ultra-low particulate air filter having a corrugated layer of fiber material.

In some embodiments, the housing has a vertically extending sidewall, a horizontally extending top wall and a sloping wall extending between the side and top walls, and at least two adjacent ones of the side, sloping and tops walls of the housing meet to form an interior angle therebetween which is greater than 90 degrees.

In yet further embodiments, the flowing of the first gas through the first diffuser tube and the flowing of the second gas through the second diffuser tube occur concurrently.

In some embodiments, the first gas is supplied to the first diffuser tube at a first end of the first diffuser tube and a second end of the first diffuser tube, opposite the first end of the first diffuser tube, is capped with a first diffuser head; and the second gas is supplied to the second diffuser tube at a first end of the second diffuser tube and a second end of the second diffuser tube, opposite the first end of the second diffuser tube, is capped with a second diffuser head.

In some further embodiments, the first and second diffuser tubes are arranged side-by-side within the housing and substantially parallel to one another.

In still further embodiments, a laminar gas flow filter apparatus is provided for supporting environmental control in a semiconductor wafer processing space, the apparatus includes: a first diffuser tube through which a gas is flowed in a first direction, thereby generating a first flow of gas laterally from the first direction through a sidewall of the first diffuser tube; a second diffuser tube through which a gas is flowed in a second direction, thereby generating a second flow of gas laterally from the second direction through a sidewall of the second diffuser tube, the second direction being opposite the first direction; and a housing containing the first and second diffuser tubes, the first and second flows of gas being combined within the housing and output from the housing to produce a laminar gas flow covering an opening to the semiconductor wafer processing space.

In yet additional embodiments, the apparatus includes an air filter through which the combined lateral flows of gas are passed prior to output from the housing.

In some further embodiments, the air filter is removably contained in the housing.

In some additional embodiments, the air filter is contained in an air filter module that is selectively attachable and detachable from the housing.

In some embodiments, the air filter is an ultra-low particulate air filter having a corrugated layer of fiber material made from at least one of polytetrafluoroethylene (PTFE), polyethylene (PE), polyethylene terephthalate (PET) and combinations thereof.

In some embodiments, the apparatus further includes: a first diffuser head and a first gas inlet connected to opposite ends of the first diffuser tube, the first diffuser head capping the first diffuser tube at the end thereof to which the first diffuser head is connected and the first gas inlet supplying a flow of gas under pressure to the first diffuser tube at the end thereof to which the first gas inlet is connected; and a second diffuser head and a second gas inlet connected to opposite ends of the second diffuser tube, the second diffuser head capping the second diffuser tube at the end thereof to which the second diffuser head is connected and the second gas inlet supplying a flow of gas under pressure to the second diffuser tube at the end thereof to which the second gas inlet is connected.

In some further embodiments, the first and second diffuser tubes are made from a porous plastic material.

In still further embodiments, an apparatus is provided for producing a laminar flow of gas, the apparatus including: a first diffuser tube having a gas permeable sidewall; a first gas inlet which supplies a flow of gas under pressure to a first end of the first diffuser tube such that a first lateral flow of gas is output through the sidewall of the first diffuser tube; a first diffuser head which caps a second end of the first diffuser tube, the second end of the first diffuser tube being opposite the first end of the first diffuser tube; a housing containing the first diffuser tube; and a filter through which an output gas flow of the apparatus exits the housing, the output gas flow being generated at least in part due to the first lateral flow of gas.

In yet further embodiments, the apparatus further includes: a second diffuser tube having a gas permeable sidewall, the second diffuser tube being arranged in the housing with the first diffuser tube; a second gas inlet which supplies a flow of gas under pressure to a first end of the second diffuser tube such that a second lateral flow of gas is output through the sidewall of the second diffuser tube; and a second diffuser head which caps a second end of the second diffuser tube, the second end of the second diffuser tube being opposite the first end of the second diffuser tube. Suitably, the first end of the second diffuser tube is proximate the second end of the first diffuser tube and the second end of the second diffuser tube is proximate the first end of the first diffuser tube; and the output gas flow is at least in part generated due to both the first and second lateral flows of gas.

In still one more embodiment, the housing includes: at least one vertically extending side surface; at least one horizontally extending top surface; and at least one sloped surface extending between the at least one side surface and the at least one top surface. Suitably, an interior angle between two adjacent ones of the side, sloped and top surfaces is obtuse.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for supporting environmental control in a semiconductor wafer processing space, said method comprising:
   flowing a first gas under pressure in a first direction through a first diffuser tube, thereby generating a first lateral flow of gas through a sidewall of the first diffuser tube;
   flowing a second gas under pressure in a second direction through a second diffuser tube, thereby generating a second lateral flow of gas through a sidewall of the second diffuser tube, said second direction being opposite the first direction;

combining the first and second lateral flows of gas within a housing; and outputting the combined lateral flows of gas from the housing to produce a laminar gas flow covering an opening to the semiconductor wafer processing space.

2. The method of claim 1, further comprising:
filtering the combined lateral flows of gas prior to said outputting from the housing.

3. The method of claim 1, wherein the first lateral flow of gas has a first gas flow velocity that increases along the first direction and the second lateral flow of gas has a second gas flow velocity that increases along the second direction.

4. The method of claim 1, wherein:
the first lateral flow of gas is substantially normal to the first direction; and
the second lateral flow of gas is substantially normal to the second direction.

5. The method of claim 1, wherein said filtering comprises:
passing the combined lateral flows of gas through an air filter, said air filter being selectively removable from the housing.

6. The method of claim 1, wherein said air filter is an ultra-low particulate air filter having a corrugated layer of fiber material.

7. The method of claim 1,
wherein the housing has a vertically extending sidewall, a horizontally extending top wall and a sloping wall extending between the side and top walls, and at least two adjacent ones of the side, sloping and tops walls of the housing meet to form an interior angle therebetween which is greater than 90 degrees.

8. The method of claim 1, wherein said flowing of the first gas through the first diffuser tube and said flowing of the second gas through the second diffuser tube occur concurrently.

9. The method of claim 1, wherein:
said first gas is supplied to the first diffuser tube at a first end of the first diffuser tube and a second end of the first diffuser tube, opposite the first end of the first diffuser tube, is capped with a first diffuser head; and
said second gas is supplied to the second diffuser tube at a first end of the second diffuser tube and a second end of the second diffuser tube, opposite the first end of the second diffuser tube, is capped with a second diffuser head.

10. The method of claim 1, wherein the first and second diffuser tubes are arranged side-by-side within the housing and substantially parallel to one another.

11. A laminar gas flow filter apparatus for supporting environmental control in a semiconductor wafer processing space, said apparatus comprising:
a first diffuser tube through which a gas is flowed in a first direction, thereby generating a first flow of gas laterally from the first direction through a sidewall of the first diffuser tube;
a second diffuser tube through which a gas is flowed in a second direction, thereby generating a second flow of gas laterally from the second direction through a sidewall of the second diffuser tube, said second direction being opposite the first direction;
a housing containing the first and second diffuser tubes, said first and second flows of gas being combined within the housing and output from the housing to produce a laminar gas flow covering an opening to the semiconductor wafer processing space;
a first diffuser head and a first gas inlet connected to opposite ends of the first diffuser tube, said first diffuser head capping the first diffuser tube at the end thereof to which the first diffuser head is connected and the first gas inlet supplying a flow of gas under pressure to the first diffuser tube at the end thereof to which the first gas inlet is connected; and
a second diffuser head and a second gas inlet connected to opposite ends of the second diffuser tube, said second diffuser head capping the second diffuser tube at the end thereof to which the second diffuser head is connected and the second gas inlet supplying a flow of gas under pressure to the second diffuser tube at the end thereof to which the second gas inlet is connected.

12. The apparatus of claim 11, said apparatus further comprising:
an air filter through which the combined lateral flows of gas are passed prior to output from the housing.

13. The apparatus of claim 12, wherein the air filter is removably contained in the housing.

14. The apparatus of claim 12, wherein the air filter is contained in an air filter module that is selectively attachable and detachable from the housing.

15. The apparatus of claim 12, wherein said air filter is an ultra-low particulate air filter having a corrugated layer of fiber material made from at least one of polytetrafluoroethylene (PTFE), polyethylene (PE), polyethylene terephthalate (PET) and combinations thereof.

16. The method of claim 11, wherein said first and second diffuser tubes are made from a porous plastic material.

17. The apparatus of claim 11, wherein the first flow of gas has a first gas flow velocity that increases along the first direction and the second flow of gas has a second gas flow velocity that increases along the second direction.

18. An apparatus for producing a laminar flow of gas, said apparatus comprising:
a first diffuser tube having a gas permeable sidewall;
a first gas inlet which supplies a flow of gas under pressure to a first end of the first diffuser tube such that a first lateral flow of gas is output through the sidewall of the first diffuser tube;
a first diffuser head which caps a second end of the first diffuser tube, said second end of the first diffuser tube being opposite the first end of the first diffuser tube;
a housing containing the first diffuser tube; and
a filter through which an output gas flow of the apparatus exits the housing, the output gas flow being generated at least in part due to the first lateral flow of gas.

19. The apparatus of claim 18, further comprising:
a second diffuser tube having a gas permeable sidewall, said second diffuser tube being arranged in the housing with the first diffuser tube;
a second gas inlet which supplies a flow of gas under pressure to a first end of the second diffuser tube such that a second lateral flow of gas is output through the sidewall of the second diffuser tube; and
a second diffuser head which caps a second end of the second diffuser tube, said second end of the second diffuser tube being opposite the first end of the second diffuser tube;
wherein the first end of the second diffuser tube is proximate the second end of the first diffuser tube and the second end of the second diffuser tube is proximate the first end of the first diffuser tube; and the output gas flow is at least in part generated due to both the first and second lateral flows of gas.

20. The apparatus of claim 18, wherein the housing comprises:
at least one vertically extending side surface;
at least one horizontally extending top surface; and
at least one sloped surface extending between the at least one side surface and the at least one top surface;
wherein an interior angle between two adjacent ones of the side, sloped and top surfaces is obtuse.

* * * * *